(12) United States Patent
Wu et al.

(10) Patent No.: US 8,933,516 B1
(45) Date of Patent: Jan. 13, 2015

(54) HIGH CAPACITY SELECT SWITCHES FOR THREE-DIMENSIONAL STRUCTURES

(71) Applicant: SanDisk 3D LLC, Milpitas, CA (US)

(72) Inventors: Ming-Che Wu, San Jose, CA (US);
Wei-Te Wu, Cupertino, CA (US);
Yung-Tin Chen, Santa Clara, CA (US)

(73) Assignee: SanDisk 3D LLC, Milpitas, CA (US)

( * ) Notice: Subject to any disclaimer, the term of this patent is extended or adjusted under 35 U.S.C. 154(b) by 0 days.

(21) Appl. No.: 13/925,662

(22) Filed: Jun. 24, 2013

(51) Int. Cl.
| | |
|---|---|
| *H01L 29/76* | (2006.01) |
| *H01L 29/94* | (2006.01) |
| *H01L 31/062* | (2012.01) |
| *H01L 31/113* | (2006.01) |
| *H01L 31/119* | (2006.01) |
| *H01L 29/788* | (2006.01) |
| *H01L 27/24* | (2006.01) |
| *H01L 45/00* | (2006.01) |

(52) U.S. Cl.
CPC ........ *H01L 27/2481* (2013.01); *H01L 27/2445* (2013.01); *H01L 27/2454* (2013.01); *H01L 45/16* (2013.01)
USPC ........... 257/390; 257/316; 257/317; 257/318; 257/319; 257/320; 257/E21.614; 257/E27.026

(58) Field of Classification Search
USPC ................ 257/316, 317, 318, 319, 320, 390, 257/E21.614, E27.026
See application file for complete search history.

(56) References Cited

U.S. PATENT DOCUMENTS

| | | | |
|---|---|---|---|
| 5,570,315 A | 10/1996 | Tanaka et al. | |
| 5,774,397 A | 6/1998 | Endoh et al. | |
| 6,046,935 A | 4/2000 | Takeuchi et al. | |
| 6,373,746 B1 | 4/2002 | Takeuchi et al. | |
| 6,456,528 B1 | 9/2002 | Chen | |
| 6,522,580 B2 | 2/2003 | Chen et al. | |
| 6,643,188 B2 | 11/2003 | Tanaka et al. | |
| 6,771,536 B2 | 8/2004 | Li et al. | |
| 6,781,877 B2 | 8/2004 | Cernea et al. | |
| 7,023,739 B2 | 4/2006 | Chen et al. | |
| 7,177,191 B2 | 2/2007 | Fasoli et al. | |
| 7,329,913 B2 | 2/2008 | Brask et al. | |
| 7,342,279 B2 | 3/2008 | Harari et al. | |
| 7,629,633 B2 | 12/2009 | Chan et al. | |
| 7,848,145 B2 * | 12/2010 | Mokhlesi et al. | ........ 365/185.17 |
| 7,902,537 B2 | 3/2011 | Schricker et al. | |
| 8,630,114 B2 * | 1/2014 | Lue | ........ 365/185.05 |
| 8,755,223 B2 * | 6/2014 | Scheuerlein | ........ 365/174 |
| 8,817,514 B2 * | 8/2014 | Samachisa et al. | ........ 365/51 |
| 2012/0147650 A1 | 6/2012 | Samachisa et al. | |
| 2013/0170283 A1 * | 7/2013 | Lan et al. | ........ 365/148 |
| 2013/0241026 A1 * | 9/2013 | Or-Bach et al. | ........ 257/506 |
| 2013/0308363 A1 * | 11/2013 | Scheuerlein et al. | ........ 365/63 |

OTHER PUBLICATIONS

Li et al., "Vertically Stacked and Independently Controlled Twin-Gate MOSFETs on a Single Si Nanowire," IEEE Electron Device Letters, vol. 32, No. 11, Nov. 2011, pp. 1492-1494.

* cited by examiner

*Primary Examiner* — Ida M Soward
(74) *Attorney, Agent, or Firm* — Davis Wright Tremaine LLP

(57) ABSTRACT

A three-dimensional nonvolatile memory array includes a select layer that selectively connects vertical bit lines to horizontal bit lines. Individual select switches of the select layer include two separately controllable transistors that are connected in series between a horizontal bit line and a vertical bit line. Each transistor in a select switch is connected to a different control circuit by a different select line.

15 Claims, 13 Drawing Sheets

HIGH CAPACITY SELECT SWITCHES FOR THREE-DIMENSIONAL STRUCTURES

BACKGROUND

This application relates to select switches used in three-dimensional structures such as memory arrays, to methods of making and using such switches, and structures containing such switches.

Uses of re-programmable non-volatile mass data storage systems utilizing flash memory are widespread for storing data of computer files, camera pictures, and data generated by and/or used by other types of hosts. A popular form of flash memory is a card that is removably connected to the host through a connector. There are many different flash memory cards that are commercially available, examples being those sold under trademarks CompactFlash (CF), the MultiMediaCard (MMC), Secure Digital (SD), miniSD, microSD, Memory Stick, Memory Stick Micro, xD-Picture Card, SmartMedia and TransFlash. These cards have unique mechanical plugs and/or electrical interfaces according to their specifications, and plug into mating receptacles provided as part of or connected with the host.

Another form of flash memory systems in widespread use is the flash drive, which is a hand held memory system in a small elongated package that has a Universal Serial Bus (USB) plug for connecting with a host by plugging it into the host's USB receptacle. In yet another form of flash memory systems, a large amount of memory is permanently installed within host systems, such as within a notebook computer, tablet computer or similar device, as a Solid State Drive (SSD), in place of the usual disk drive mass data storage system. Each of these three forms of mass data storage systems generally includes the same type of flash memory arrays. They each also usually contain its own memory controller and drivers but there are also some memory only systems that are instead controlled at least in part by software executed by the host to which the memory is connected. The flash memory is typically formed on one or more integrated circuit chips and the controller on another circuit chip. But in some memory systems that include the controller, especially those embedded within a host, the memory, controller and drivers are often formed on a single integrated circuit chip.

Flash memory systems typically utilize integrated circuits with arrays of memory cells that individually store an electrical charge that controls the threshold level of the memory cells according to the data being stored in them. Electrically conductive floating gates are most commonly provided as part of the memory cells to store the charge but dielectric charge trapping material is alternatively used. A NAND architecture is generally preferred for the memory cell arrays used for large capacity mass storage systems. Other architectures, such as NOR, are typically used instead for small capacity memories. Examples of NAND flash arrays and their operation as part of flash memory systems may be had by reference to U.S. Pat. Nos. 5,570,315, 5,774,397, 6,046,935, 6,373,746, 6,456,528, 6,522,580, 6,643,188, 6,771,536, 6,781,877 and 7,342,279.

The amount of integrated circuit area necessary for each bit of data stored in the memory cell array has been reduced significantly over the years, and the goal remains to reduce this further. The cost and size of the flash memory systems are therefore being reduced as a result. The use of the NAND array architecture contributes to this but other approaches have also been employed to reducing the size of memory cell arrays. One of these other approaches is to form, on a semiconductor substrate, multiple two-dimensional memory cell arrays, one on top of another in different planes, instead of the more typical single array. Examples of integrated circuits having multiple stacked NAND flash memory cell array planes are given in U.S. Pat. Nos. 7,023,739 and 7,177,191.

Another type of re-programmable non-volatile memory cell uses variable resistance memory elements that may be set to either conductive or non-conductive states (or, alternately, low or high resistance states, respectively), and some additionally to partially conductive states and remain in that state until subsequently re-set to the initial condition. The variable resistance elements are individually connected between two orthogonally extending conductors (typically bit and word lines) where they cross each other in a two-dimensional array. The state of such an element is typically changed by proper voltages being placed on the intersecting conductors. Since these voltages are necessarily also applied to a large number of other unselected resistive elements because they are connected along the same conductors as the states of selected elements being programmed or read, diodes are commonly connected in series with the variable resistive elements in order to reduce leakage currents that can flow through them. The desire to perform data reading and programming operations with a large number of memory cells in parallel results in reading or programming voltages being applied to a very large number of other memory cells. An example of an array of variable resistive memory elements and associated diodes is given in U.S. Pat. No. 7,902,537.

Portions of a 3-dimensional memory array may be accessed using select switches that are controlled by select lines. In general, the size of such select switches is limited by the pitch of the memory array, which tends to get smaller from one generation to the next. On the other hand, select transistors may be required to provide larger currents as they connect ever-larger numbers of memory cells (e.g. as more cells are added in vertical stacks by increasing the number of layers in such vertical stacks). It is desirable to make select switches that can satisfy such conflicting demands by supplying a large current while occupying a small area on a die.

SUMMARY

An example of a select switch in a memory array is located between a horizontal global bit line and a vertical local bit line. The select switch includes two transistors connected in series. The two transistors have separate gates that can be separately biased by separate control circuits. Such a select switch can provide increased current to a vertical bit line compared with a single transistor, and can better isolate a vertical bit line from a global bit line, without occupying any more die area.

An example of a 3-dimensional memory structure includes: a stack of memory cells connected by a vertical conductor that extends in a vertical direction that is perpendicular to a surface of a substrate; a horizontal conductor that extends parallel to the surface of the substrate and is selectively electrically connectable with the vertical conductor; and a select switch between the vertical conductor and the horizontal conductor, the select switch including a first transistor and a second transistor connected in series between the vertical conductor and the horizontal conductor.

The first transistor may be an NMOS transistor and the second transistor is an NMOS transistor. The first transistor may be an NMOS transistor and the second transistor may be a PMOS transistor. The first transistor may be a bipolar junction transistor and the second transistor may be a bipolar junction transistor. The first transistor and the second transistor may be gate-all-around transistors. The first transistor may have a first gate that is connected to a first select line and the second transistor may have a second gate that is connected to a second select line. The first select line and the second select line may be separately controlled and may be biased to different voltages. The first select line and the second select line may extend in a direction that is parallel to the surface of the substrate and is perpendicular to the horizontal conductor. The first select line and the second select line may be coupled to additional select switches that are located between additional horizontal conductors and additional vertical conductors. The plurality of memory cells may comprise charge storage elements that are programmable to at least two different charge levels that represent at least two logic states. The plurality of memory cells may comprise resistive elements that are programmable to at least two different resistance levels that represent at least two logic states.

An example of a 3-dimensional memory structure in a space defined by orthogonal x, y, and z directions, includes: a plurality of vertical conductors that extend in the z-direction, each of the plurality of vertical conductors coupled to a plurality of memory cells; a plurality of word lines extending in the x-direction, each of the plurality of word lines coupled to a row of memory cells; a plurality of horizontal conductors that extend in the y-direction and are selectively electrically connectable with the plurality of vertical conductors; a plurality of select switches, each of the plurality of select switches located between an individual vertical conductor and an individual horizontal conductor to selectively electrically connect the individual vertical conductor to the individual horizontal conductor or electrically isolate the individual vertical conductor from the individual horizontal conductor, each of the plurality of switches including a first transistor and a second transistor connected in series between the vertical conductor and the horizontal conductor; a first plurality of select lines that extend in the x-direction and form gates of the first transistors; and a second plurality of select lines that extend in the x-direction and form gates of the second transistors.

An individual select line of the second plurality of select lines may overlie an individual select line of the first plurality of select lines, with an intervening dielectric layer providing electrical isolation between them. Memory access circuits may be connected to apply a first bias to the individual select line of the first plurality of select lines and to apply a second bias to the individual select line of the second plurality of select lines, the first bias and the second bias being separately controllable. The select lines of the first plurality of select lines may encircle channels of the first transistors and select lines of the second plurality of select lines may encircle channels of the second transistors.

An example of a method of forming a 3-dimensional memory array includes: forming a plurality of horizontal conductors; forming a plurality of first select transistors that have lower terminals connected to the horizontal conductors; forming a plurality of second select transistors that have lower terminals that are connected to upper terminals of the first select transistors; and forming stacks of memory cells that are coupled in a vertical direction by a plurality of vertical conductors connected to upper terminals of second transistors.

Forming the plurality of first select transistors may include forming first select lines that encircle channels of first transistors, and forming the plurality of second select transistors may include forming second select lines that encircle channels of second transistors, the first and second select lines extending perpendicular to the horizontal conductors and perpendicular to the horizontal conductors. Peripheral circuits may be formed, including select control circuits that separately control bias on first select lines and second select lines. Forming the stacks of memory cells may include depositing read/write material to form resistive read/write memory cells. Forming the stacks of memory cells may include depositing charge trapping material to form charge storage memory cells.

Various aspects, advantages, features and details of the innovative three-dimensional variable resistive element memory system are included in a description of exemplary examples thereof that follows, which description should be taken in conjunction with the accompanying drawings.

All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

DESCRIPTION OF EXEMPLARY EMBODIMENTS

Figure 1:
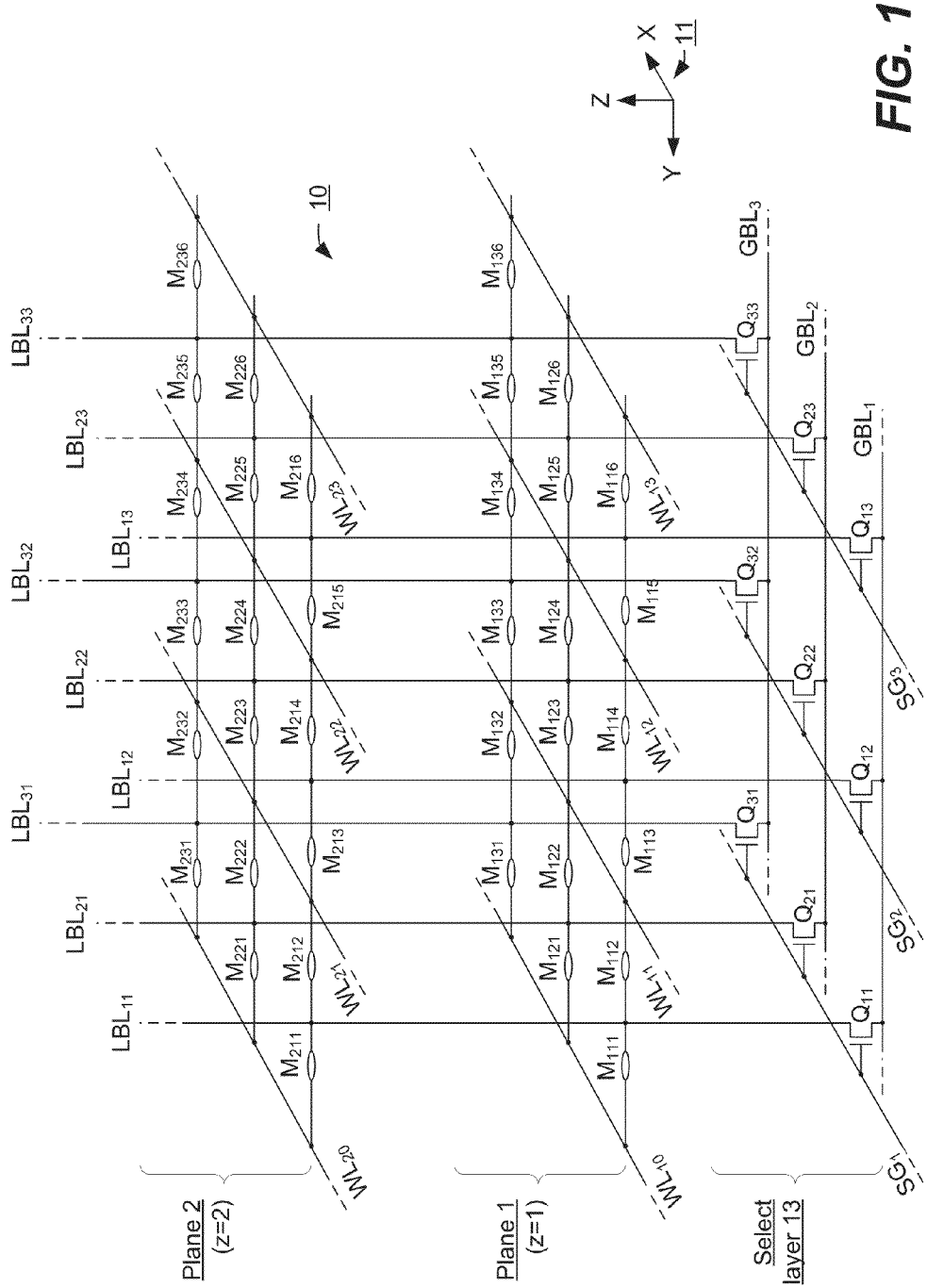
FIG. 1 is an equivalent circuit of a portion of a three-dimensional array of variable resistance memory elements, wherein the array has vertical bit lines.

Referring initially to FIG. 1, the architecture of a three-dimensional memory 10 is schematically and generally illustrated in the form of an equivalent circuit of a portion of such a memory. This is a specific example of the three-dimensional array summarized above. A standard three-dimensional rectangular coordinate system 11 is used for reference, the directions of each of vectors x, y and z being orthogonal with the other two. Examples of such three-dimensional arrays are provided in U.S. Patent Publication No. 2012/0147650.

A circuit for selectively connecting internal memory elements with external data circuits may be formed in a semiconductor substrate or a select layer 13. In this specific example, a two-dimensional array of select or switching devices $Q_{xy}$ are utilized, where x gives a relative position of the device in the x-direction and y its relative position in the y-direction. Global bit lines ($GBL_x$) are elongated in the y-direction and have relative positions in the x-direction that are indicated by the subscript. The global bit lines ($GBL_x$) are individually connectable with the source or drain of the select devices Q having the same position in the x-direction, although during reading and also typically programming only one select device connected with a specific global bit line is turned on at time. The other of the source or drain of the individual select devices Q is connected with one of the local bit lines ($LBL_{xy}$). The local bit lines are elongated vertically, in the z-direction, and form a regular two-dimensional array in the x (row) and y (column) directions.

In order to connect one set (in this example, designated as one row) of local bit lines with corresponding global bit lines, control gate lines $SG_y$ are elongated in the x-direction and connect with control terminals (gates) of a single row of select devices $Q_{xy}$ having a common position in the y-direction. The select devices $Q_{xy}$ therefore connect one row of local bit lines ($LBL_{xy}$) across the x-direction (having the same position in the y-direction) at a time to corresponding ones of the global bit-lines ($GBL_x$), depending upon which of the control gate lines $SG_y$ receives a voltage that turns on the select devices to which it is connected. The remaining control gate lines receive voltages that keep their connected select devices off.

Memory storage elements $M_{zxy}$ are formed in a plurality of planes positioned at different distances in the z-direction above the substrate 13. Two planes 1 and 2 are illustrated in FIG. 1 but there will typically be more, such as 4, 6 or even more. In each plane at distance z, word lines $WL_{zy}$ are elongated in the x-direction and spaced apart in the y-direction between the local bit-lines ($LBL_{xy}$). The word lines $WL_{zy}$ of each plane individually cross adjacent two of the local bit-lines $LBL_{xy}$ on either side of the word lines. The individual memory storage elements $M_{zxy}$ are connected between one local bit line $LBL_{xy}$ and one word line $WL_{zy}$ adjacent these individual crossings. An individual memory element $M_{zxy}$ is therefore addressable by placing proper voltages on the local bit line $LBL_{xy}$ and word line $WL_{zy}$ between which the memory element is connected. The voltages are chosen to provide the electrical stimulus necessary to cause the state of the memory element to change from an existing state to the desired new state. The levels, duration and other characteristics of these voltages depend upon the material that is used for the memory elements.

Each "plane" of the three-dimensional memory cell structure is typically formed of at least two layers, one in which the conductive word lines $WL_{zy}$ are positioned and another of a dielectric material that electrically isolates the planes from each other. Additional layers may also be present in each plane, depending for example on the structure of the memory elements $M_{zxy}$. The planes are stacked on top of each other on a semiconductor substrate with the local bit lines $LBL_{xy}$ being connected with storage elements $M_{zxy}$ of each plane through which the local bit lines extend.

Figure 2:
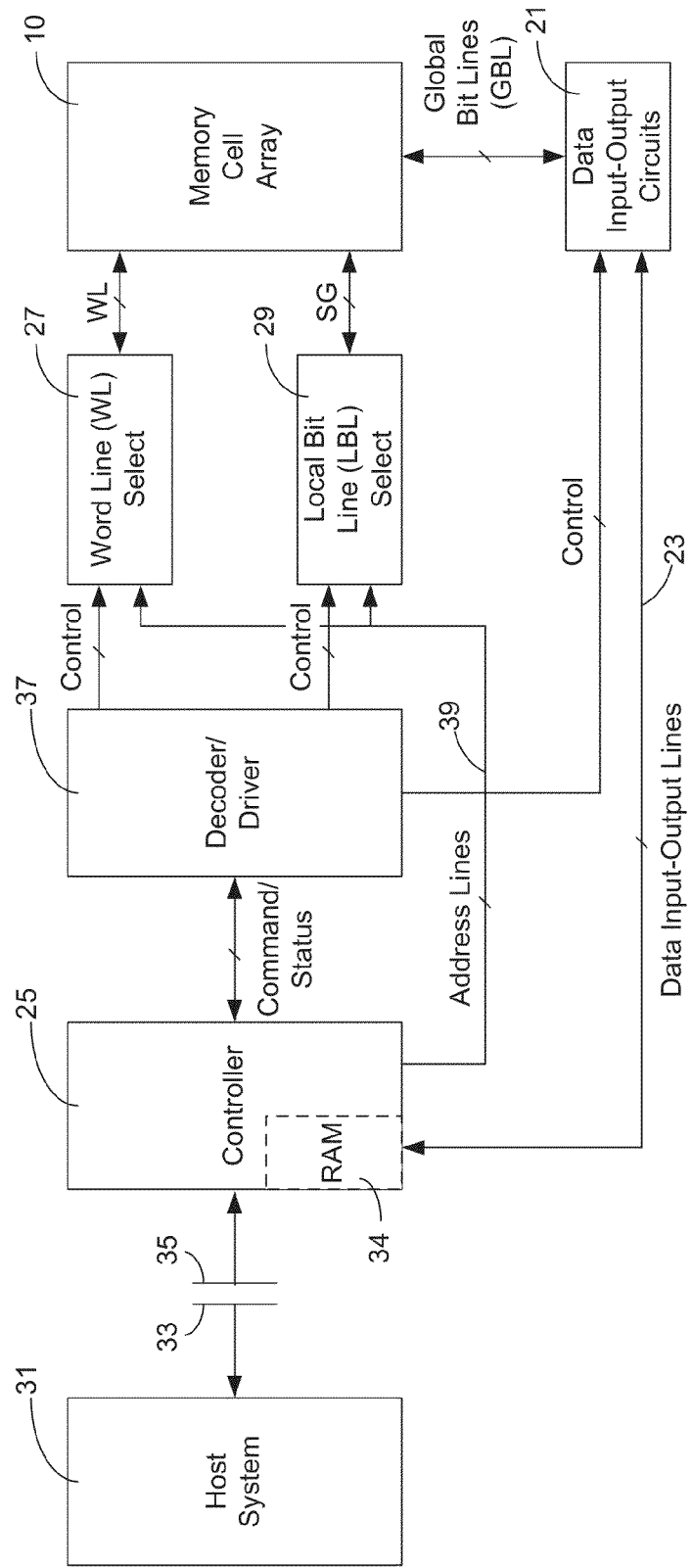
FIG. 2 is a schematic block diagram of a re-programmable non-volatile memory system which utilizes the memory cell array of FIG. 1, and which indicates connection of the memory system with a host system.

FIG. 2 is a block diagram of an illustrative memory system that can use the three-dimensional memory 10 of FIG. 1. Data input-output circuits 21 are connected to provide (during programming) and receive (during reading) analog electrical quantities in parallel over the global bit-lines $GBL_x$ of FIG. 1 that are representative of data stored in addressed storage elements $M_{zxy}$. The circuits 21 typically contain sense amplifiers for converting these electrical quantities into digital data values during reading, which digital values are then conveyed over lines 23 to a memory system controller 25. Conversely, data to be programmed into the array 10 are sent by the controller 25 to the input-output circuits 21, which then programs that data into addressed memory element by placing proper voltages on the global bit lines $GBL_x$. For binary operation, one voltage level is typically placed on a global bit line to represent a binary "1" and another voltage level to represent a binary "0". The memory elements are addressed for reading or programming by voltages placed on the word lines $WL_{zy}$ and select gate control lines $SG_y$ by respective word line select circuits 27 and local bit line circuits 29. In the specific three-dimensional array of FIG. 1, the memory elements lying between a selected word line and any of the local bit lines $LBL_{xy}$ connected at one instance through the select devices $Q_{xy}$ to the global bit lines $GBL_x$ may be addressed for programming or reading by appropriate voltages being applied through the select circuits 27 and 29.

The memory system controller 25 typically receives data from and sends data to a host system 31. The controller 25 usually contains an amount of random-access-memory (RAM) 34 for temporarily storing such data and operating information. Commands, status signals and addresses of data being read or programmed are also exchanged between the controller 25 and host 31. The memory system operates with a wide variety of host systems. They include personal computers (PCs), laptop and other portable computers, cellular telephones, personal digital assistants (PDAs), digital still cameras, digital movie cameras and portable audio players. The host typically includes a built-in receptacle 33 for one or more types of memory cards or flash drives that accepts a mating memory system plug 35 of the memory system but some hosts require the use of adapters into which a memory card is plugged, and others require the use of cables therebetween. Alternatively, the memory system may be built into the host system as an integral part thereof.

The memory system controller 25 conveys to decoder/driver circuits 37 commands received from the host. Similarly, status signals generated by the memory system are communicated to the controller 25 from the circuits 37. The circuits 37 can be simple logic circuits in the case where the controller controls nearly all of the memory operations, or can include a state machine to control at least some of the repetitive memory operations necessary to carry out given commands. Control signals resulting from decoding commands are applied from the circuits 37 to the word line select circuits 27, local bit line select circuits 29 and data input-output circuits 21. Also connected to the circuits 27 and 29 are address lines 39 from the controller that carry physical addresses of memory elements to be accessed within the array 10 in order to carry out a command from the host. The physical addresses correspond to logical addresses received from the host system 31, the conversion being made by the controller 25 and/or the decoder/driver 37. As a result, the circuits 29 partially address the designated storage elements within the array 10 by placing proper voltages on the control elements of the select devices $Q_{xy}$ to connect selected local bit lines ($LBL_{xy}$) with the global bit lines ($GBL_x$). The addressing is completed by the circuits 27 applying proper voltages to the word lines $WL_{zy}$ of the array.

Although the memory system of FIG. 2 utilizes the three-dimensional memory element array 10 of FIG. 1, the system is not limited to use of only that array architecture. A given memory system may alternatively combine this type of memory with other another type including flash memory, such as flash having a NAND memory cell array architecture, a magnetic disk drive or some other type of memory. The other type of memory may have its own controller or may in some cases share the controller 25 with the three-dimensional memory cell array 10, particularly if there is some compatibility between the two types of memory at an operational level.

Although each of the memory elements $M_{zxy}$ in the array of FIG. 1 may be individually addressed for changing its state according to incoming data or for reading its existing storage state, it is certainly preferable to program and read the array in units of multiple memory elements in parallel. In the three-dimensional array of FIG. 1, one row of memory elements on one plane may be programmed and read in parallel. The number of memory elements operated in parallel depends on the number of memory elements connected to the selected word line. In some arrays, the word lines may be segmented (not shown in FIG. 1) so that only a portion of the total number of memory elements connected along their length may be addressed for parallel operation, namely the memory elements connected to a selected one of the segments.

Previously programmed memory elements whose data have become obsolete may be addressed and re-programmed from the states in which they were previously programmed. The states of the memory elements being re-programmed in parallel will therefore most often have different starting states among them. This is acceptable for many memory element materials but it is usually preferred to re-set a group of memory elements to a common state before they are re-programmed. For this purpose, the memory elements may be grouped into blocks, where the memory elements of each block are simultaneously reset to a common state, preferably one of the programmed states, in preparation for subsequently programming them. If the memory element material being used is characterized by changing from a first to a second state in significantly less time than it takes to be changed from the second state back to the first state, then the reset operation is preferably chosen to cause the transition taking the longer time to be made. The programming is then done faster than resetting. The longer reset time is usually not a problem since resetting blocks of memory elements containing nothing but obsolete data is typically accomplished in a high percentage of the cases in the background, therefore not adversely impacting the programming performance of the memory system.

With the use of block re-setting of memory elements, a three-dimensional array of variable resistive memory elements may be operated in a manner similar to current flash memory cell arrays. Resetting a block of memory elements to a common state corresponds to erasing a block of flash memory cells to an erased state. The individual blocks of memory elements herein may be further divided into a plurality of pages of storage elements, wherein the memory elements of a page are programmed and read together. This is like the use of pages in flash memories. The memory elements of an individual page are programmed and read together. Of course, when programming, those memory elements that are to store data that are represented by the reset state are not changed from the reset state. Those of the memory elements of a page that need to be changed to another state in order to represent the data being stored in them have their states changed by the programming operation.

Figure 3:
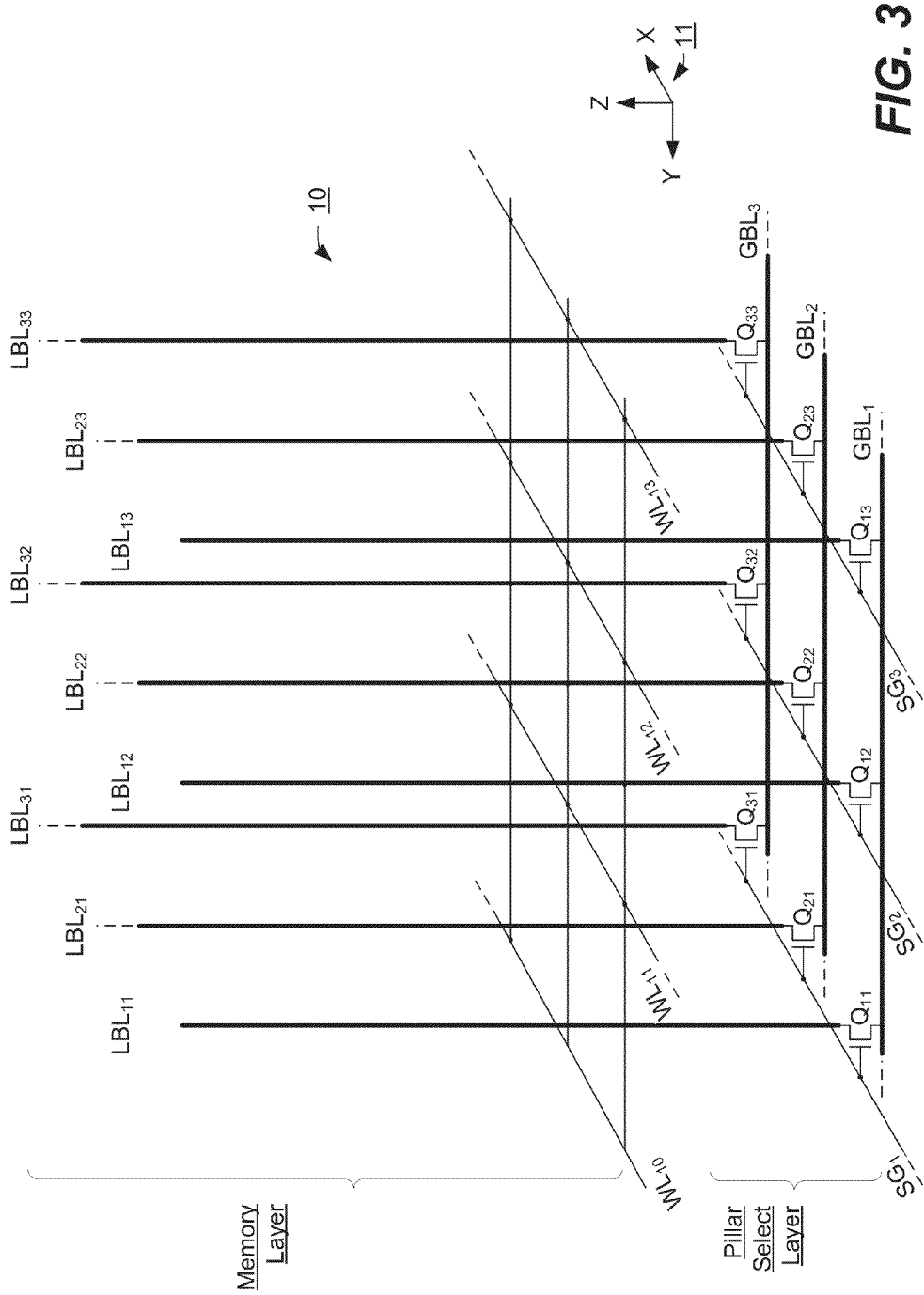
FIG. 3 illustrates schematically the 3D memory comprising of a memory layer on top of a pillar select layer.

FIG. 3 shows an example of a memory layer that has multiple local bit lines, or pillars, and a pillar select layer that contains a pillar select device, or switch, for each pillar. Each pillar select switch consists of a single transistor in this example. Where a large number of memory cells are served by such a select device it may be difficult to provide adequate current to the vertical bit line. In particular, the footprint of such a select device in the x-y plane is generally limited by the pitch of the memory array (the transistor should fit under the column of memory cells that it serves). As memory pitch becomes smaller, select transistors become smaller. Also, increasing memory density may require more memory cells per vertical bit line so that select transistors must be capable of providing more current. Providing ever-more current through a transistor that must fit in an ever-smaller footprint is not always achievable.

According to an aspect of the invention, a nonvolatile memory is provided with a 3D array of read/write (R/W) memory elements accessible by an x-y-z framework of an array of local bit lines or bit line pillars in the z-direction and word lines in multiple layers in the x-y plane perpendicular to the z-direction. An x-array of global bit lines in the y-direction is switchably coupled to individual ones of the local bit line pillars along the y-direction. This is accomplished by a select switch between each of the individual local bit line pillars and a global bit line. Each select switch is formed as a vertical structure, switching between a local bit line pillar and a global bit line.

Figure 4A:
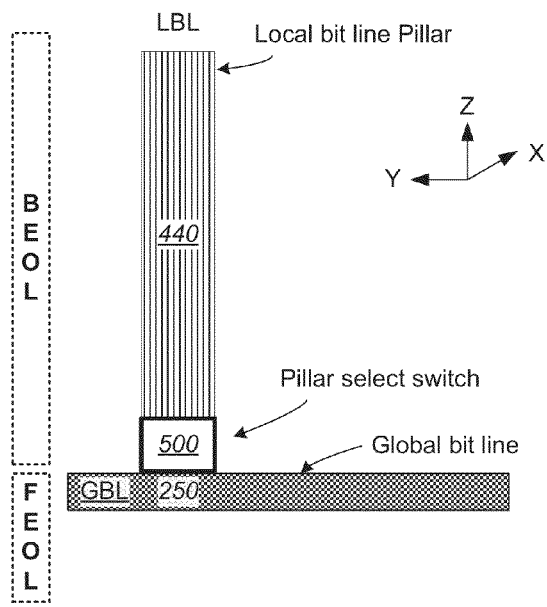
FIG. 4A illustrates the location of the pillar select switch, in relation to the local bit line and the global bit line.

FIG. 4A illustrates the location of the select switch in relation to the local bit line and the global bit line. The global bit line such as GBL 250 may be formed in the FEOL as part of the metal layer-1 or metal layer-2. The pillar select switch 500 is formed in the BEOL layer on top of the GBL 250. The local bit line LBL 440, in the form of a pillar, is formed on top of the pillar select switch 500. In this way, the pillar select switch 500 can electrically connect LBC 440 to the global bit line GBL 250, or isolate LBL 440 from GBL 250. The pillar select layer is where the pillar select switch is formed between each local bit line pillar 440 and a global bit line 250.

Two-Transistor Select Switch

According to an aspect of the present invention, a pillar select switch is formed of two, vertically stacked transistors. The two transistors may be separately controllable so that they can be biased differently. The two transistors may be similar or may be different. By placing two transistors in series between a global bit line and a vertical local bit line, the current capacity of the pillar select switch may be increased when the switch is "on" without increasing the footprint of the pillar select switch. When the switch is "off" leakage current may be reduced by the series connected transistors.

Figure 4B:
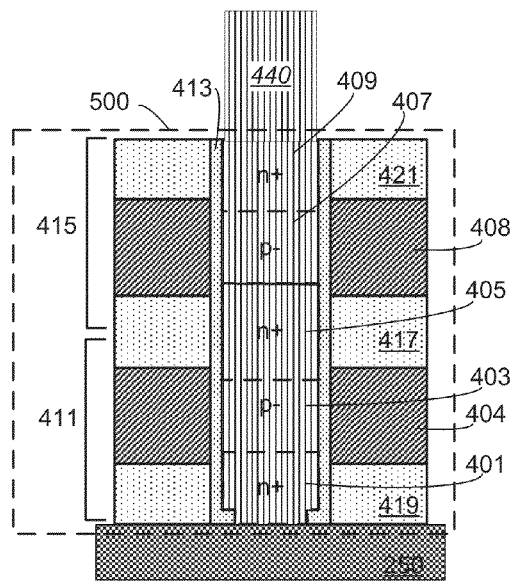
FIG. 4B illustrates an example of a pillar select switch.

FIG. 4B shows a cross-section of a two-transistor select switch 500 according to an example. In this example, both transistors are NMOS devices and may be considered Vertical Thin Film Transistors (VTFTs). A lower transistor 411 is formed with an N-type drain region 401, a P-type body 403, and an N-type source region 405. A channel is formed where a lower gate 404 is coupled to the body 403 through a gate dielectric layer 413. An upper transistor 415 is formed with an N-type drain region 405, a P-type body 407, and an N-type source region 409. A channel is formed where an upper gate 408 is coupled to the body 407 through a gate dielectric layer 413. The upper gate 408 and lower gate 404 are separated by a dielectric layer 417. A dielectric layer 419 provides electrical isolation below the lower gate 404 (between lower gate and global bit line). Another dielectric layer 421 provides electrical isolation above the upper gate 408. Upper and lower gates encircle their respective channels in what may be referred to as a "gate-all-round" structure. Thus, while FIG. 4B shows a cross section along the y-z plane, a cross section along the x-z plane would also show both upper and lower gate portions on either side of the gate. An example of how such a two-transistor select switch may be formed is described below.

Figure 4C:
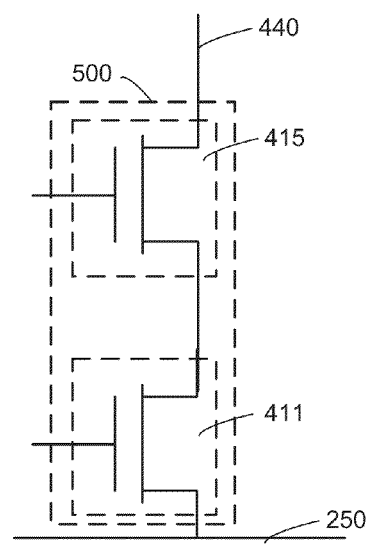
FIG. 4C is a schematic of the example pillar select switch of FIG. 4B.

FIG. 4C is a schematic of the two-transistor structure of the select switch 500. In particular, FIG. 4C shows lower transistor 411 connected in series with upper transistor 415 between the global bit line 250 and the local bit line 440. Each transistor has a separate gate that may be separately biased. The separate gates may be controlled by separate control circuits that are connected through separate select lines. While the examples described here refer to specific structures for the transistors used, it will be understood that any suitable transistor structure may be used and that physical dimensions, doping levels, materials and other parameters may be modified according to requirements.

FIGS. 5-11 illustrate an example of a process for forming a memory that includes a select layer in which select switches each include two transistors that are connected in series between a global bit line and a local bit line.

Figure 5:
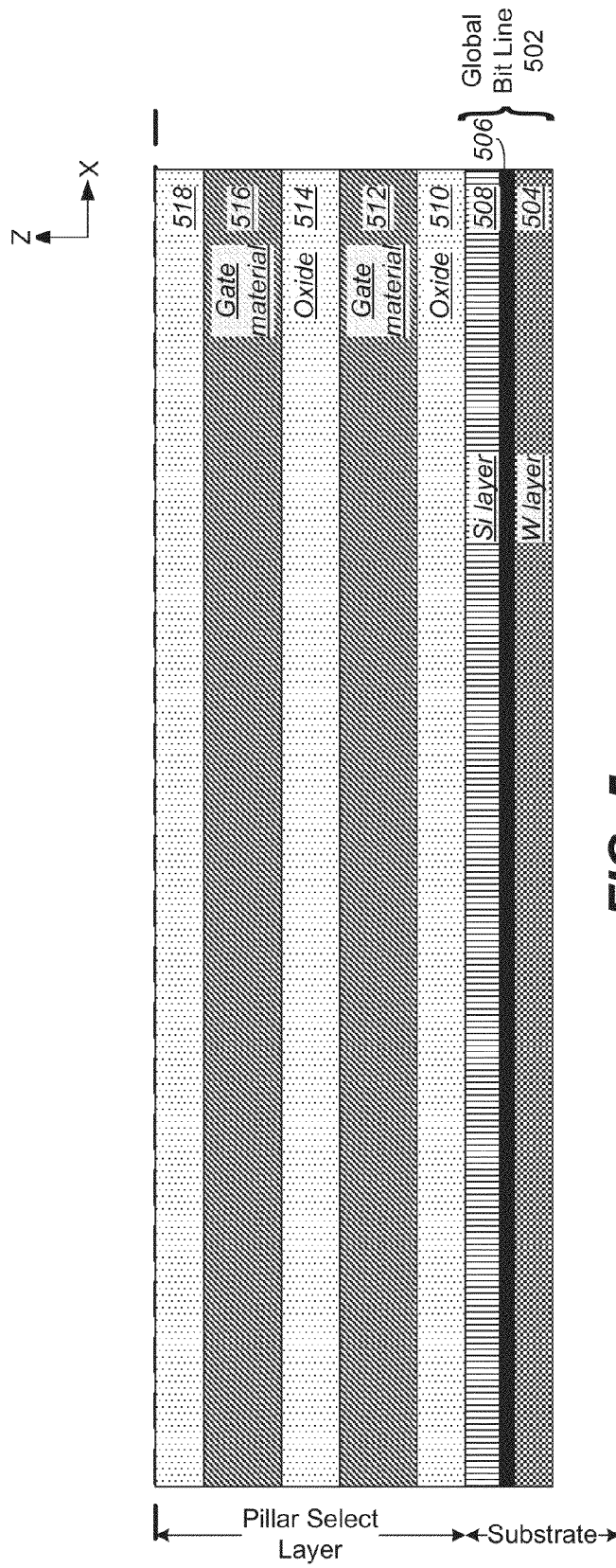
FIG. 5 illustrates a global bit line in a substrate with a pillar select layer on top at an intermediate stage of fabrication.

FIG. 5 shows a cross section along the x-z plane at an intermediate stage of fabrication. A global bit line 502 extends along the x-direction in the substrate. In this example, the global bit line is formed of a tungsten (W) layer 504 with an overlying titanium nitride (TiN) layer 506 and a silicon layer 508 on the titanium nitride layer. A pillar select layer includes a stack of layers formed over the substrate in which the global bit lines are located.

The pillar select layer includes a dielectric layer 510, silicon dioxide, or "oxide" in this example, followed by a lower gate layer 512, which may be formed of doped polysilicon or other suitable conductive material. Over the lower gate layer 512 is another dielectric layer 514, which may be oxide, and an upper gate layer 516, which may be doped polysilicon. Thus, dielectric-layer 514 provides isolation between lower gate layer 512 and upper gate layer 516. Another dielectric layer 518 overlies upper gate layer 516. The layers shown in the pillar select layer may be formed by blanket deposition across a substrate and may subsequently be patterned to form individual select switches.

Figure 6:
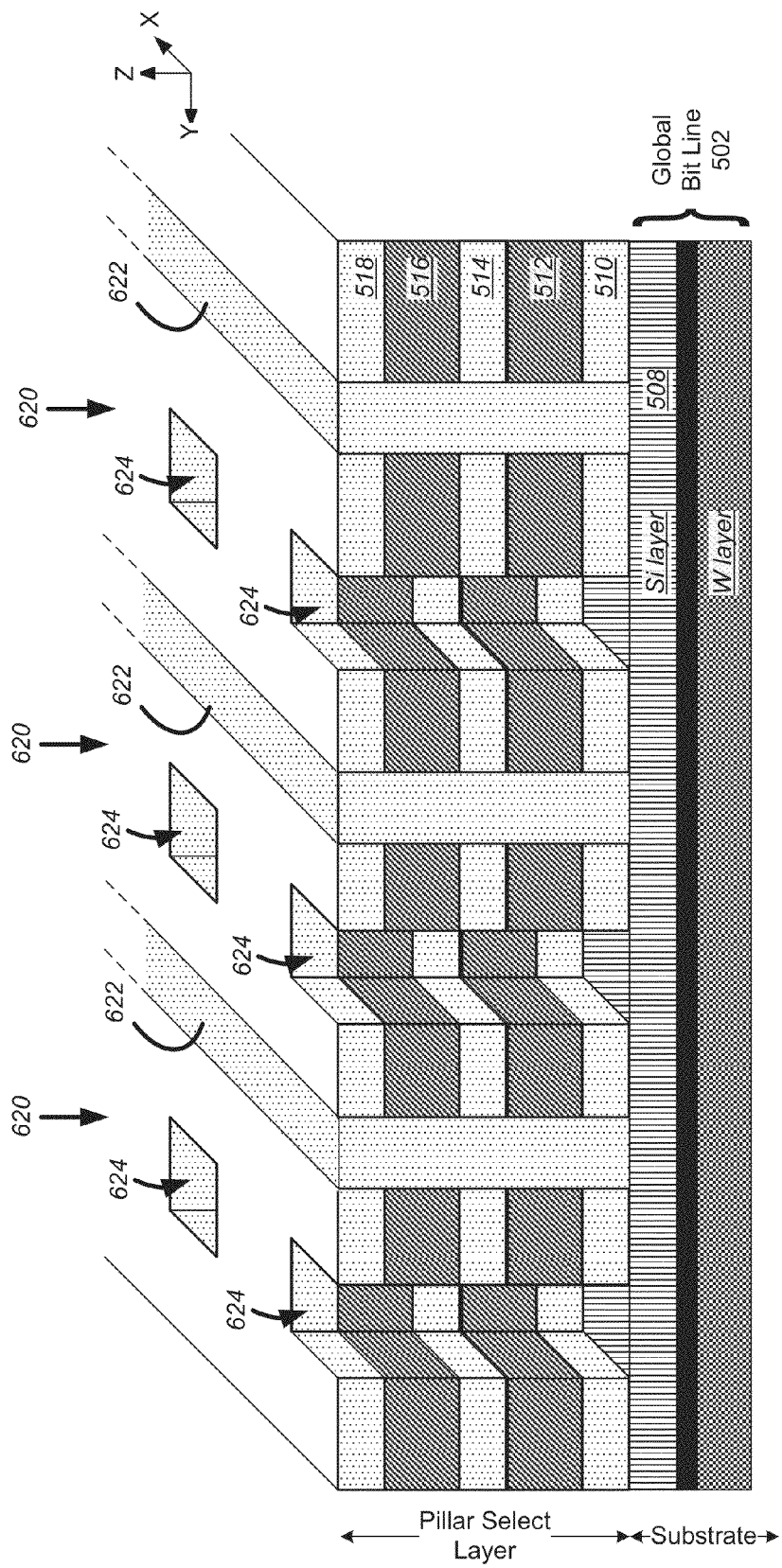
FIG. 6 illustrates the pillar select layer of FIG. 5 after separation of select lines and formation of openings.

FIG. 6 is a cut-away view that shows the pillar select layer of FIG. 5 after patterning and etching to form separate select lines and to form holes where transistor channels may be formed. The patterning used may be conventional direct photolithography, or may include using double patterning to form features that are smaller than the minimum feature size that is achievable using direct photolithography. Examples of double patterning processes are described in U.S. Pat. No. 8,194,470. Etching may include any suitable anisotropic etching, e.g. Reactive Ion Etching (RTE).

Select line stacks 620 extend along the x-direction and are separated by dielectric portions 622 which may be formed by etching trenches through the pillar select layer stack and filling the trenches with dielectric material. Excess dielectric material may be removed by CMP or otherwise to leave a planarized surface. Select line stacks each include a lower select line formed by lower gate layer 512 and an upper select line formed by upper gate layer 516.

Holes 624 extend down through select line stacks where individual select switches are to be formed between global bit lines 502 and local bit lines. At the bottom of holes 624, silicon layer 508 of global bit lines 502 is exposed.

Figure 7:
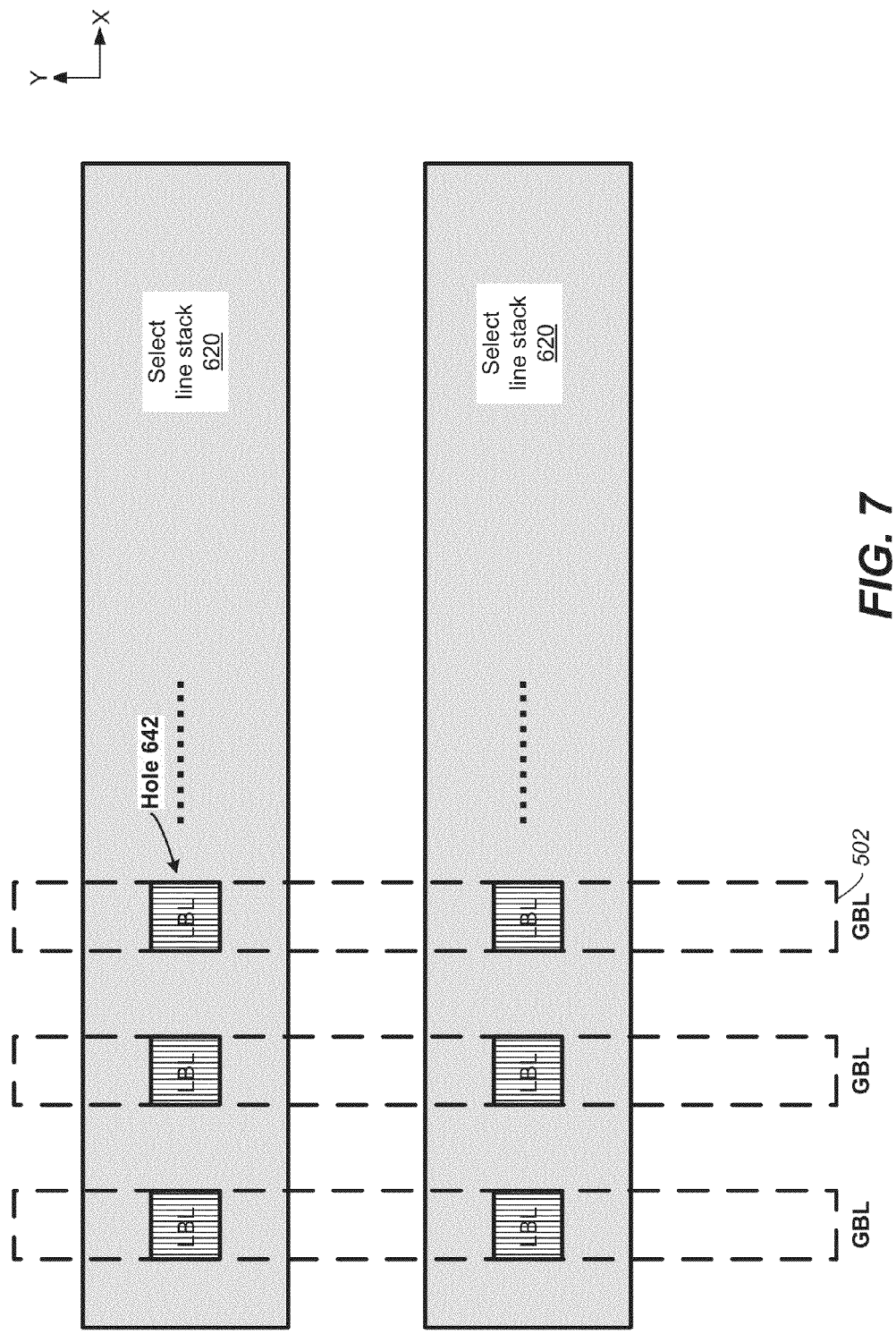
FIG. 7 shows a top-down view (along z-direction) of the structure of FIG. 6.

FIG. 7 shows a top-down view of the structure shown in FIG. 6 illustrating how select line stacks 620, each including two select lines, extend in the x-direction and intersect global bit lines 502 which extend in the y-direction. Where they intersect, holes 624 are formed through select line stacks 620 to expose the top (silicon) surface of global bit lines 502.

Figure 8:
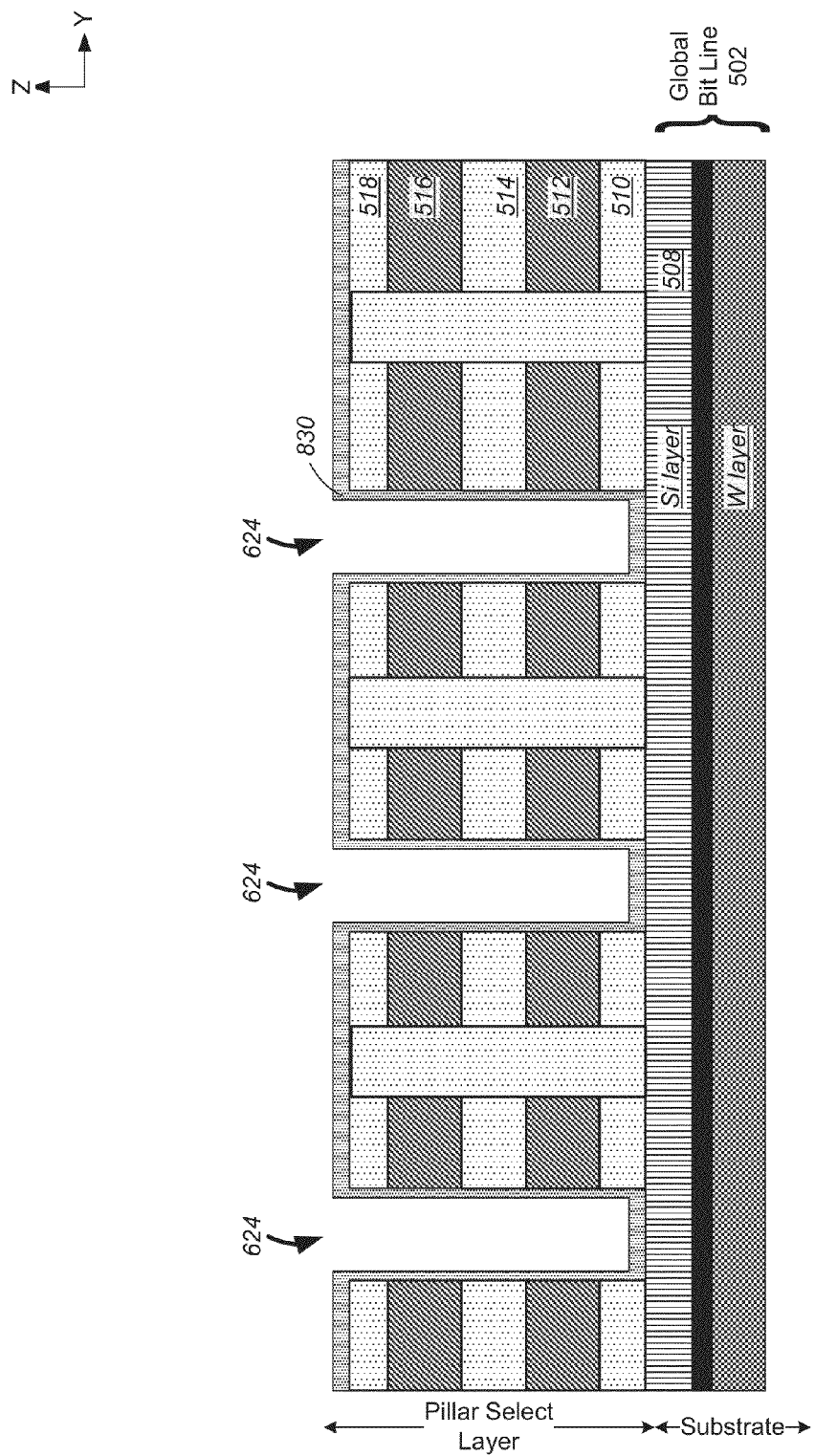
FIG. 8 shows formation of gate dielectric layers.

FIG. 8 is a cross section showing the formation of a gate dielectric layer 830 that extends to cover the insides surfaces of holes 624. Sidewalls and bottom surfaces of holes 624 may be coated by an isotropic deposition process such as a Chemical Vapor Deposition (CVD) process.

Figure 9:
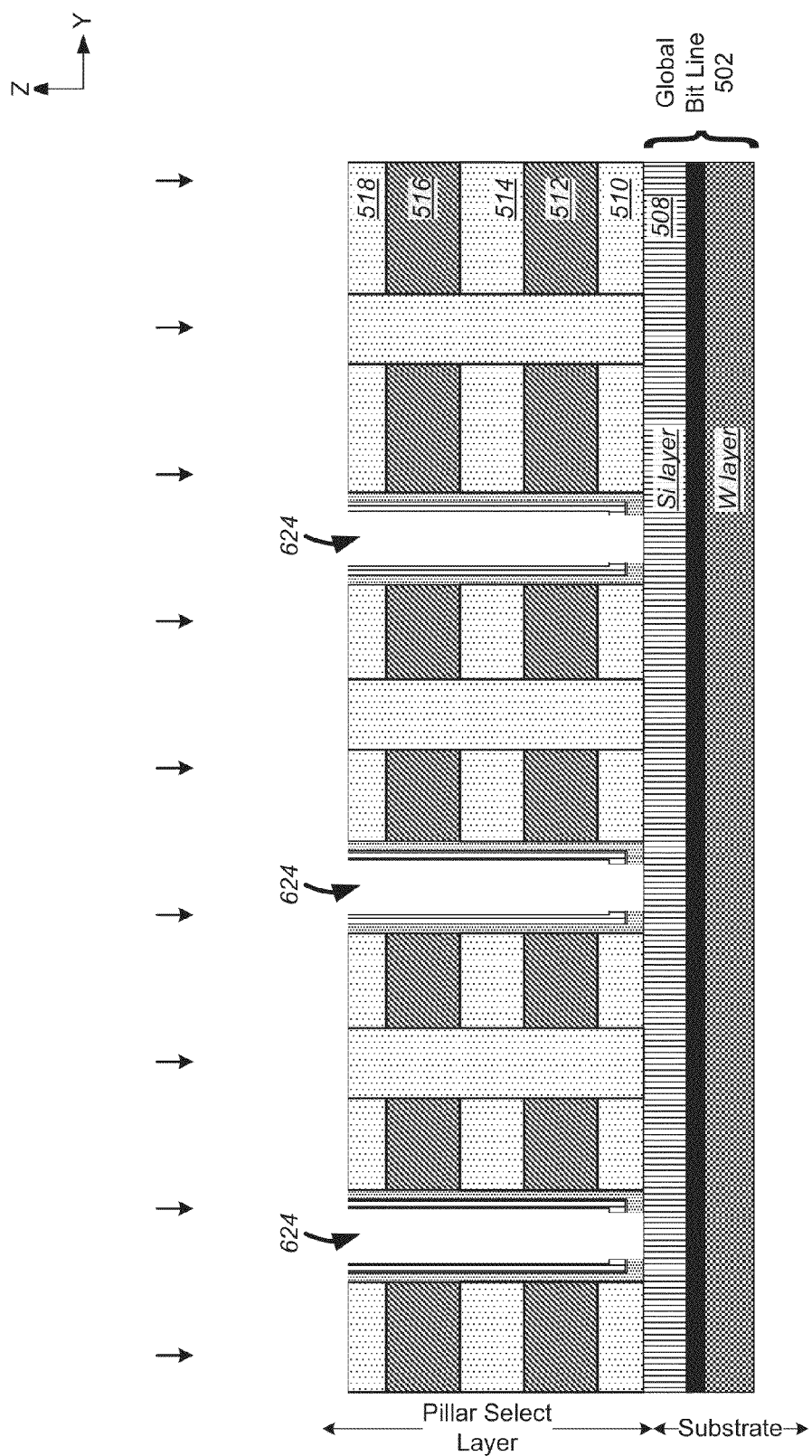
FIG. 9 shows removal of excess gate dielectric material to expose global word lines.

FIG. 9 shows the results of etching of gate dielectric layer 830 of FIG. 8 to expose silicon layer 508 of global bit line 502 and to remove excess gate dielectric material overlying dielectric layer 518. This etch may be performed using a suitable anisotropic etch so that gate dielectric layer 830 along sidewalls of holes 624 remains in place.

Figure 10:
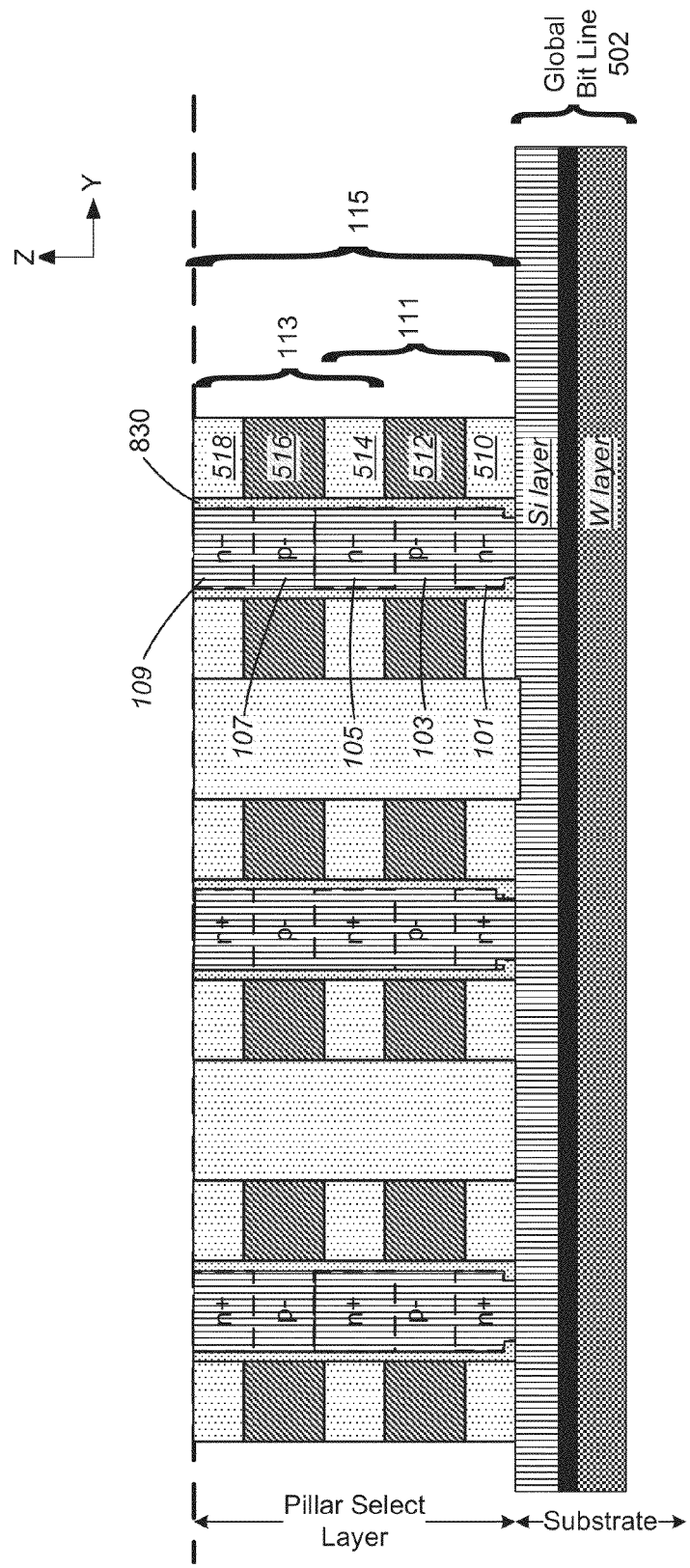
FIG. 10 shows formation of select transistor source regions, drain regions, and channels.

FIG. 10 shows formation of source regions, drain regions, and bodies of transistors of select switches. In particular, a lower N+ drain region 101 is formed adjacent to the global bit line 502. A P− lower body 103 is formed over drain region 101 and an N+ lower source region 105 is formed over lower body 103. A lower transistor channel is formed where lower select line material 512 is coupled through gate dielectric layer 830. It will be understood that this channel extends around all sides of lower body 103.

A P− upper body 107 is formed over the N+ lower source region 105, which also serves as the upper drain region. Essentially, N+ region 105 is both the source of a lower transistor 111 and the drain of an upper transistor 113. An N+ upper source region 109 is formed over the upper body 107. An upper transistor channel is formed where the upper select line material 516 is coupled through gate dielectric layer 830. Thus, two transistors 111, 113 are connected in series to form a select switch 115.

Source, drain, and body regions may be formed and doped by any suitable method. In one example, Selective Epitaxial Growth (SEG) is used to form these regions from in-situ doped single-crystal silicon that is grown on exposed portions of silicon of global bit lines 502. In other examples, other techniques may be used including deposition of in-situ doped polysilicon, or deposition of a layer of material followed by implantation, or diffusion, followed by deposition of a subsequent layer.

Figure 11:
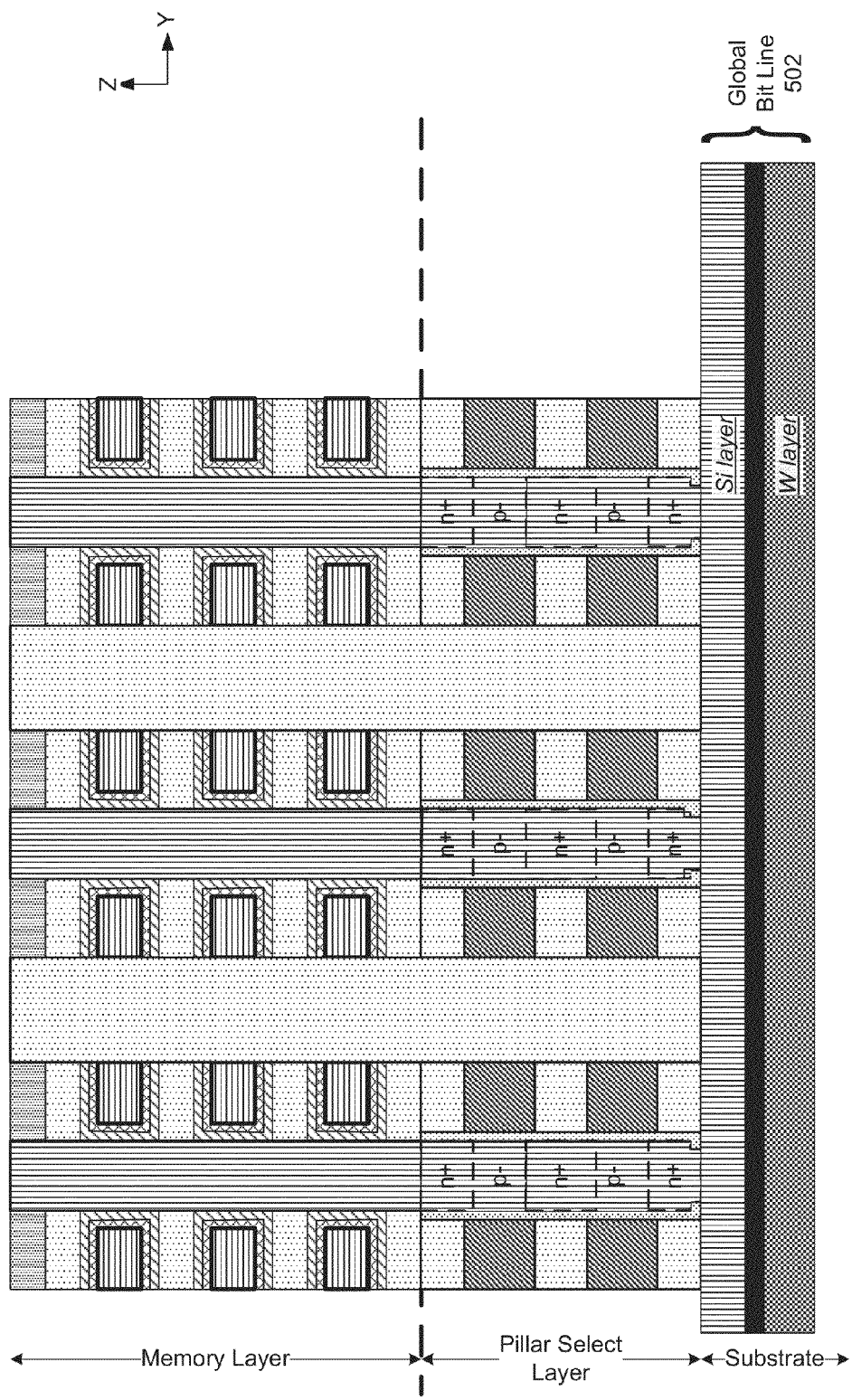
FIG. 11 shows formation of a memory layer over the pillar select layer.

FIG. 11 shows the pillar select layer of FIG. 10 with a memory layer formed over it so that each select switch serves a local bit line and connects it to (or isolates it from) a global bit line. Formation of the memory layer may be performed using any suitable process, for example as described in U.S. Patent Publication No. 2012/0147650.

Figure 12:
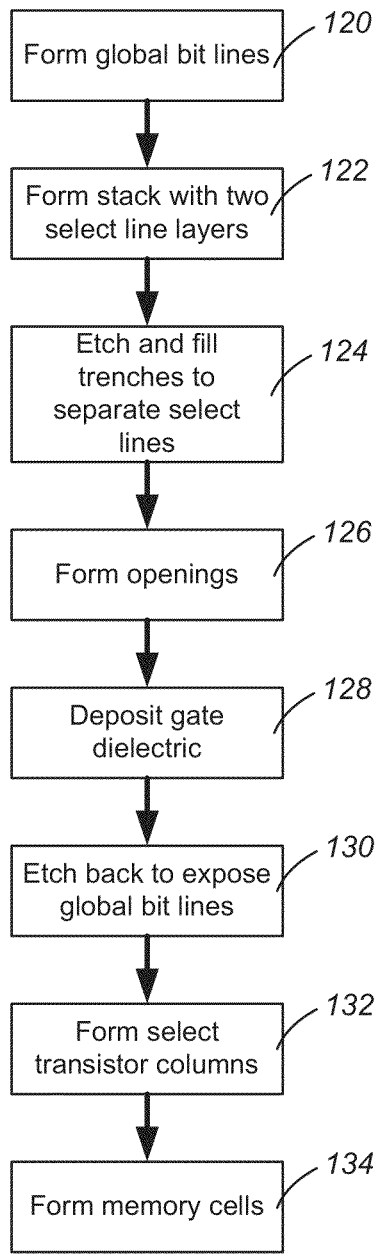
FIG. 12 is a flowchart illustrating process steps to form the structure of FIG. 11.

FIG. 12 summarizes the process steps used to form the pillar select layer. Global bit lines are formed 120 extending across a substrate in a first direction. Global bit lines may be formed in the substrate in trenches or otherwise. Subsequently a pillar select stack is formed 122 that includes two select line layers, a lower select line layer and an upper select line layer, separated by a dielectric layer. The pillar select stack is divided into separate select line stacks by patterning and anisotropic etching and the trenches between select line stacks are then filled with suitable dielectric 124. Openings, or holes, are also formed 126. While this example shows trenches formed and filled first, before holes are formed, this order is not essential. A gate dielectric layer is deposited 128 so that it lies along sidewalls of openings or holes and is etched back 130 to expose global bit lines at the bottom of holes. A central column of the two select transistors is formed 132 by depositing appropriately doped material. For example, in-situ doped SEG deposition may be used to form a silicon column that includes source, drain, and channel regions. Memory cells are then formed 134 in a memory layer overlying the pillar select layer.

Figure 13:
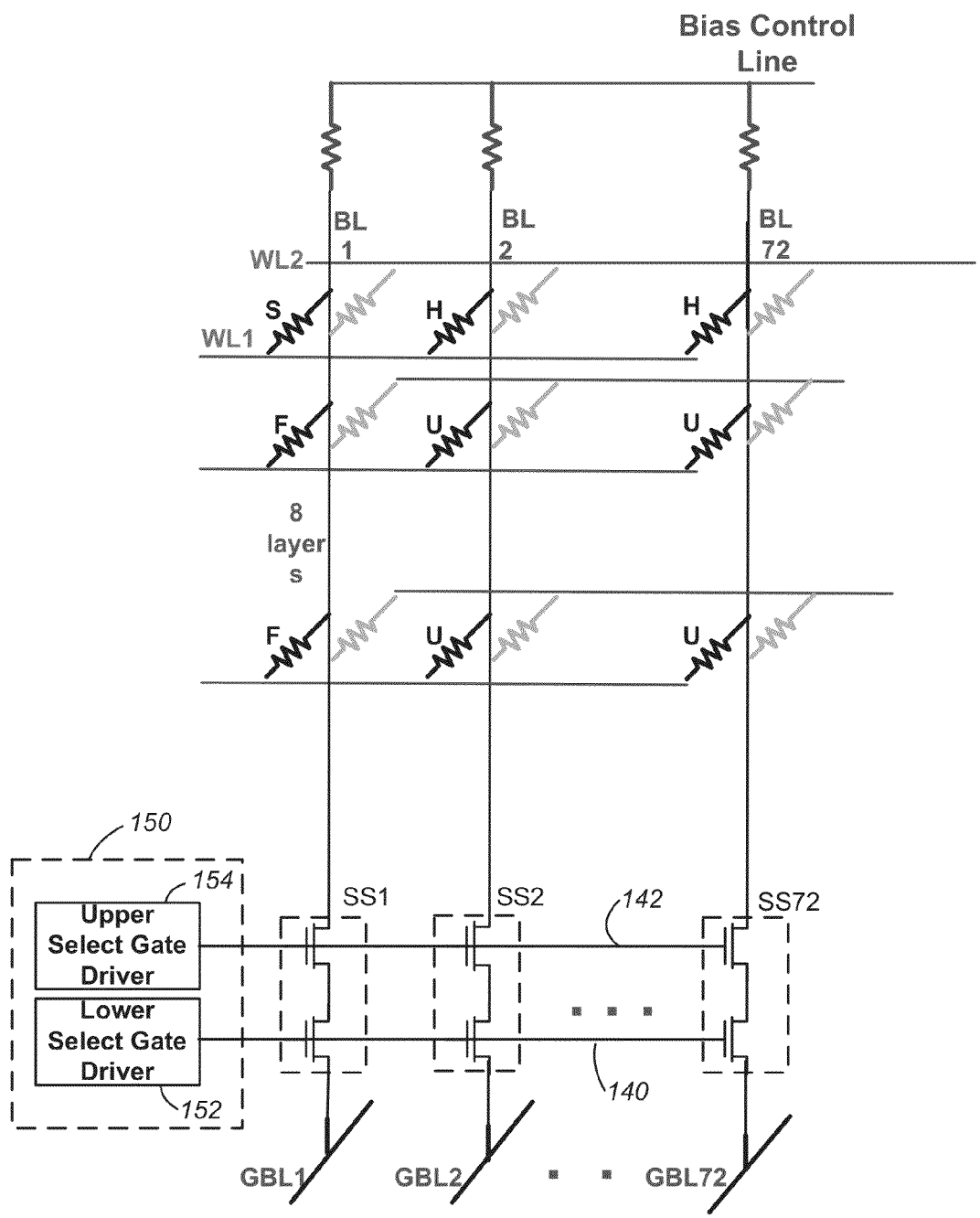
FIG. 13 shows separate select control circuits for lower and upper select lines.

FIG. 13 illustrates how the structure formed above may be connected to provide select switching for high currents in a small footprint. In particular, FIG. 13 shows how a set of local bit lines, BL1-BL72 are selectively connected to (or isolated from) corresponding global bit lines GBL1-GBL72 by a set of select switches SS1-SS72. The set of select switches SS1-SS72 receive the same voltages on their gates and are controlled together to allow a row of local bit lines to be selected together. Each select switch includes a lower transistor that has a lower transistor gate formed by lower select line 140 and an upper transistor gate formed by upper select line 142. Lower select line 140 and upper select line 142 may be separately controlled so that they may be at different voltages at any given time.

FIG. 13 shows select gate driver circuits that are formed in access circuits 150. In particular, lower select gate driver 152 applies a voltage to lower select line 140 and upper select gate driver 154 applies another voltage to upper select line 142. By applying appropriate voltages to these select lines, a large current may be supplied to the local bit lines. In particular, each transistor may supply significant gate-source current which augments its drain-source current to provide a higher total current to the local bit line than just the current from the corresponding global bit line. Put differently, the global bit line supplies some of the current to the local bit line with additional current provided by gate-source currents of the two transistors.

Leakage through transistors that are nominally "off" is common in memory arrays. A local bit line that is connected to a global bit line through a single transistor may be partially coupled to the global bit line even when the transistor is nominally "off" because of such leakage. This may lead to unwanted effects including disturbance of previously programmed data and potential loss of such data, increased write and erase times, false reads, and increased power consumption. By providing two transistors in series, the effects of leakage through any one transistor may be limited. In general, two transistors in series, receiving appropriate biases, will provide superior isolation compared with a single transistor and therefore will better protect stored data. Because the two transistors are vertically stacked they occupy the same area on a die as a single similar transistor and are compatible with memories that have very small feature sizes.

CONCLUSION

Although the various aspects of the present invention have been described with respect to exemplary embodiments thereof, it will be understood that the present invention is entitled to protection within the full scope of the appended claims.

It is claimed:

1. A 3-dimensional memory structure comprising:
  a stack of memory cells connected by a vertical conductor that extends in a vertical direction that is perpendicular to a surface of a substrate;
  a horizontal conductor that extends parallel to the surface of the substrate and is selectively electrically connectable with the vertical conductor; and
  a select switch between the vertical conductor and the horizontal conductor, the select switch including a first transistor and a second transistor connected in series between the vertical conductor and the horizontal conductor.

2. The 3-dimensional memory structure of claim 1 wherein the first transistor is an NMOS transistor and the second transistor is an NMOS transistor.

3. The 3-dimensional memory structure of claim 1 wherein the first transistor is an NMOS transistor and the second transistor is a PMOS transistor.

4. The 3-dimensional memory structure of claim 1 wherein the first transistor is a bipolar junction transistor and the second transistor is a bipolar junction transistor.

5. The 3-dimensional memory structure of claim 1 wherein the first transistor and the second transistor are gate-all-around transistors.

6. The 3-dimensional memory structure of claim 5 wherein the first transistor has a first gate that is connected to a first select line and the second transistor has a second gate that is connected to a second select line.

7. The 3-dimensional memory structure of claim 6 wherein the first select line and the second select line are separately controlled and may be biased to different voltages.

8. The 3-dimensional memory structure of claim 7 wherein the first select line and the second select line extend in a direction that is parallel to the surface of the substrate and is perpendicular to the horizontal conductor.

9. The 3-dimensional memory structure of claim 8 wherein the first select line and the second select line are coupled to additional select switches that are located between additional horizontal conductors and additional vertical conductors.

10. The 3-dimensional memory structure of claim 1 wherein the plurality of memory cells comprise charge storage elements that are programmable to at least two different charge levels that represent at least two logic states.

11. The 3-dimensional memory structure of claim 1 wherein the plurality of memory cells comprise resistive elements that are programmable to at least two different resistance levels that represent at least two logic states.

12. A 3-dimensional memory structure in a space defined by orthogonal x, y, and z directions, comprising:
  a plurality of vertical conductors that extend in the z-direction, each of the plurality of vertical conductors coupled to a plurality of memory cells;
  a plurality of word lines extending in the x-direction, each of the plurality of word lines coupled to a row of memory cells;
  a plurality of horizontal conductors that extend in the y-direction and are selectively electrically connectable with the plurality of vertical conductors;
  a plurality of select switches, each of the plurality of select switches located between an individual vertical conductor and an individual horizontal conductor to selectively electrically connect the individual vertical conductor to the individual horizontal conductor or electrically isolate the individual vertical conductor from the individual horizontal conductor, each of the plurality of switches including a first transistor and a second transistor connected in series between the vertical conductor and the horizontal conductor;
  a first plurality of select lines that extend in the x-direction and form gates of the first transistors; and
  a second plurality of select lines that extend in the x-direction and form gates of the second transistors.

13. The 3-dimensional memory structure of claim 12 wherein an individual select line of the second plurality of select lines overlies an individual select line of the first plurality of select lines, with an intervening dielectric layer providing electrical isolation between them.

14. The 3-dimensional memory structure of claim 13 further comprising memory access circuits connected to apply a first bias to the individual select line of the first plurality of select lines and to apply a second bias to the individual select line of the second plurality of select lines, the first bias and the second bias being separately controllable.

15. The 3-dimensional memory structure of claim 12 wherein select lines of the first plurality of select lines encircle channels of the first transistors and select lines of the second plurality of select lines encircle channels of the second transistors.

* * * * *